(12) United States Patent
Pawlak et al.

(10) Patent No.: US 8,900,891 B2
(45) Date of Patent: Dec. 2, 2014

(54) FABRICATION METHOD FOR INTERDIGITATED BACK CONTACT PHOTOVOLTAIC CELLS

(75) Inventors: Bartlomiej Jan Pawlak, Leuven (BE); Tom Janssens, Zellik (BE)

(73) Assignee: IMEC, Leuven (BE)

( * ) Notice: Subject to any disclaimer, the term of this patent is extended or adjusted under 35 U.S.C. 154(b) by 780 days.

(21) Appl. No.: 13/160,434

(22) Filed: Jun. 14, 2011

(65) Prior Publication Data

US 2011/0303280 A1   Dec. 15, 2011

Related U.S. Application Data

(60) Provisional application No. 61/354,634, filed on Jun. 14, 2010.

(51) Int. Cl.
*H01L 21/00* (2006.01)
*H01L 29/04* (2006.01)
*H01L 31/0224* (2006.01)
*H01L 31/18* (2006.01)
*H01L 31/068* (2012.01)

(52) U.S. Cl.
CPC ........... *H01L 31/1804* (2013.01); *Y02E 10/547* (2013.01); *H01L 31/022441* (2013.01); *H01L 31/0682* (2013.01)
USPC ................... 438/22; 438/24; 438/45; 438/80; 257/53; 257/59

(58) Field of Classification Search
CPC ....... Y02E 10/547; Y02E 10/50; Y02E 10/52; H01L 31/1804; H01L 31/0682; H01L 31/022425; H01L 31/022441; H01L 31/068; H01L 31/18; H01L 21/266; H01L 31/0747; H01L 31/0516; H01L 31/022433; H01L 31/05; H01J 2237/31711; H01J 37/3171
USPC ................. 438/22, 24, 45, 80; 257/53, 59, 72
See application file for complete search history.

(56) References Cited

U.S. PATENT DOCUMENTS 5,053,083 A   10/1991   Sinton
(Continued)

FOREIGN PATENT DOCUMENTS

WO   WO 2009/029900   3/2009
WO   WO 2009/065066   5/2009

OTHER PUBLICATIONS

Engelhart et al., "Laser Structuring for Back Junction Silicon Solar Cells", Prog. Photovolt: Res. Appl., 2007, 15:237-243.
(Continued)

*Primary Examiner* — Hsien Ming Lee
(74) *Attorney, Agent, or Firm* — Knobbe, Martens, Olson & Bear LLP

(57) ABSTRACT

A method for manufacturing interdigitated back contact photovoltaic cells is disclosed. In one aspect, the method includes providing on a rear surface of a substrate a first doped layer of a first dopant type, and providing a dielectric masking layer overlaying it. Grooves are formed through the dielectric masking layer and first doped layer, extending into the substrate in a direction substantially orthogonal to the rear surface and extending in a lateral direction underneath the first doped layer at sides of the grooves. Directional doping is performed in a direction substantially orthogonal to the rear surface, thereby providing doped regions with dopants of a second dopant type at a bottom of the grooves. Dopant diffusion is performed to form at the rear side of the substrate one of the emitter regions and back surface field regions between the grooves and the other at the bottom of the grooves.

21 Claims, 4 Drawing Sheets

(56) References Cited

U.S. PATENT DOCUMENTS

| | | |
|---|---|---|
| 7,999,175 B2 * | 8/2011 | Nakayashiki et al. ........ 136/255 |
| 2009/0227095 A1 | 9/2009 | Bateman et al. |
| 2009/0308438 A1 | 12/2009 | De Ceuster et al. |
| 2010/0059109 A1 * | 3/2010 | Nakayashiki et al. ........ 136/255 |
| 2011/0151610 A1 * | 6/2011 | Ramappa et al. ............... 438/57 |

OTHER PUBLICATIONS

Papet et al., "Realization of Self-Aligned Back-Contact Solar Cells", Electrochemical and Solid-State Letters, 2008, 11 (5) H114-H117.

Verlinden et al., "Super Self-Aligned Technology for Backside Contact Solar Cells: A Route to Low Cost and High Efficiency", IEEE, 1990, 257-262.

* cited by examiner

FABRICATION METHOD FOR INTERDIGITATED BACK CONTACT PHOTOVOLTAIC CELLS

CROSS REFERENCE TO RELATED APPLICATIONS

This application claims priority under 35 U.S.C. §119(e) to U.S. provisional patent application 61/354,634 filed on Jun. 14, 2010, which application is hereby incorporated by reference in its entirety.

BACKGROUND OF THE INVENTION

1. Field of the Invention

The present invention relates to methods for fabrication of interdigitated back contact photovoltaic cells.

2. Description of the Related Technology

Interdigitated back contact (IBC) cells are photovoltaic cells having both emitter contacts and base contacts at the rear side of the cells, the emitter contacts and base contacts being interdigitated for separate collection of electrons and holes. Eliminating front side contacts avoids the need for making a trade-off between shading losses and series resistance. Fabrication processes for IBC cells often require several masking steps and alignment steps, because at the rear side of the cells there is a need for separating emitter regions and base regions and for separating and properly aligning emitter contacts and base contacts.

Methods have been proposed for reducing the complexity of process sequences for manufacturing IBC cells. For example, in "Realization of self-aligned back contact cells", Electrochemical and Solid-State Letters, 11 (5), H114-H117, 2008, P. Papet et al describe a process sequence wherein only one lithography step is used and wherein no alignment steps are needed afterwards. Separation between emitter contacts and base contacts is obtained by chemical etching of grooves in a silicon substrate using a metal mask, wherein underetching of the mask leads to the formation of cantilevers, the cantilevers being sufficiently large (a few micrometers) to avoid short circuits between both contact types after metal deposition.

In "Super self-aligned technology for backside contact solar cells: a route to low cost and high efficiency", IEEE PVSC 1990, P. Verlinden et al propose a method for fabricating backside contact photovoltaic cells, the method requiring only one photolithography step without alignment. Separation between n+ doped regions and p+ doped regions at the rear side of the cells is obtained by chemically etching grooves in the silicon substrate using an oxide mask and underetching the mask such that oxide cantilevers are formed at the sides of the grooves. The bottom and the sidewalls of the grooves are thermally oxidized to provide a passivation layer, and a silicon nitride layer is deposited on top of the oxide layer. Next, using anisotropic Reactive Ion Etching, and using the cantilevers as a mask, a window is opened in the oxide layer and the nitride layer at the bottom of the grooves. The silicon oxide layer and the silicon nitride layer remain at the sidewalls of the grooves. A boron predeposition is then performed and both doping regions (n+ emitter region and p+ region in the base) are diffused in a single high temperature step. In order to provide a separation between n+ doped regions and p+ doped regions, the silicon oxide/silicon nitride stack present at the sidewalls of the grooves is used as a masking layer. For forming emitter contacts and base contacts, an Al layer is deposited by vacuum evaporation which features a very poor step coverage, such that the presence of the cantilevers leads to a separation between emitter contacts and base contacts.

SUMMARY OF CERTAIN INVENTIVE ASPECTS

Certain inventive aspects relate to a good method for manufacturing solar cells with both contacts at the rear.

Certain inventive aspects relate to a method for manufacturing interdigitated back contact photovoltaic cells wherein the need for lithography steps and the need for alignment steps are avoided, and wherein the number of process steps is reduced as compared to prior art processes. In a method according to one embodiment, the need for providing a masking layer for separating n-type doped regions and p-type doped regions is avoided. A combination of providing cantilevers or overhanging parts at the sides of grooves etched in a silicon substrate and directional doping is used for the separation between n-type doped regions and p-type doped regions. Diffusion of dopants for forming an emitter, a back surface field and a front surface field can be performed in a single step. In addition, the cantilevers can also be used for separation between emitter contacts and base contacts, such that a single metallization step can be used for forming both contact types.

In a first embodiment, there is a method for fabricating interdigitated back contact photovoltaic cells, the method comprising: providing on a rear surface of a semiconductor, e.g. silicon, substrate a first doped layer comprising a first dopant type; providing a dielectric masking layer overlaying the first doped layer; forming a plurality of grooves through the dielectric masking layer and the first doped layer, the plurality of grooves extending into the silicon in a direction substantially orthogonal, e.g. orthogonal, to the rear surface and extending in a lateral direction underneath the first doped layer at sides of the plurality of grooves; performing a directional doping in a direction substantially orthogonal, e.g. orthogonal, to the rear surface, thereby providing dopants of a second dopant type different from the first dopant type at a bottom of the plurality of grooves; performing a dopant diffusion, thereby forming at the rear side of the substrate doped regions of a first type in between the plurality of grooves and doped regions of a second type at the bottom of the plurality of grooves. With "substantially orthogonal to the rear surface" is meant deviating not more than 30°, preferably not more than 10° from an orthogonal to the rear surface.

It is an advantage of certain embodiments that the doped regions of the first type and the doped regions of the second type are 'self-aligned', i.e. there is no need for providing a dedicated mask or masking layer for separating the doped regions of the first type from the doped regions of the second type.

It is an advantage of certain embodiments that the back surface field and the emitter are produced simultaneously. This provides a simplified way of processing solar cells.

In certain embodiments, the substrate can for example be an n-type substrate, the first dopant type can be n-type and the second dopant type can be p-type. In such embodiment the dopant diffusion may comprise forming n-type regions (e.g. back surface field regions) in between the plurality of grooves and p-type regions (e.g. emitter regions) at the bottom of the plurality of grooves.

Alternatively, in certain embodiments, the substrate can for example be an n-type substrate, the first dopant type can be p-type and the second dopant type can be n-type. In such embodiment the dopant diffusion may comprise forming p-type regions (e.g. emitter regions) in between the plurality of grooves and n-type regions (e.g. back surface field regions) at the bottom of the plurality of grooves.

Alternatively, in certain embodiments, the substrate can for example be a p-type substrate, the first dopant type can be p-type and the second dopant type can be n-type. In such embodiment the dopant diffusion may comprise forming p-type regions (e.g. back surface field regions) in between the plurality of grooves and n-type regions (e.g. emitter regions) at the bottom of the plurality of grooves.

Alternatively, in certain embodiments, the substrate can for example be a p-type substrate, the first dopant type can be n-type and the second dopant type can be p-type. In such embodiment the dopant diffusion may comprise forming n-type regions (e.g. emitter regions) in between the plurality of grooves and p-type regions (e.g. back surface field regions) at the bottom of the plurality of grooves.

The first doped layer can for example be a doped oxide layer or a doped amorphous semiconductor layer, e.g. amorphous silicon layer.

The dielectric masking layer can be a single layer or a stack of layers. The dielectric masking layer can include any suitable dielectric layer, such as for example an oxide layer and/or a nitride layer.

Forming the plurality of grooves can for example be done by laser ablation, followed by wet etching for underetching the dielectric masking layer and the first doped layer, the wet etching process resulting in an extension of the grooves in a lateral direction (i.e. a direction substantially parallel to the rear surface) underneath the first doped layer. Wet etching can for example comprise etching in any suitable wet etching solution, e.g. a NaOH solution or a KOH solution. The etching solution may be dependent on the substrate. As an alternative to laser ablation, for example dry etching can be used (e.g. DRIE: deep reactive ion etching) or screenprinting of a paste that selectively etches dielectric layers.

The plurality of grooves can for example be parallel grooves, e.g. having a rectangular shape in a plane parallel to the substrate surface.

The depth (i.e. the size in a direction orthogonal to the substrate surface) of the grooves can for example be in the range between about 1 micrometer and 5 micrometer and the lateral size (in a direction parallel to the substrate surface) can for example be in the range between about 40 micrometer and 2 mm, for example in the range between about 100 micrometer and 1 mm, for example in the order of about 300 micrometer. The pitch between the grooves can for example be in the range between about 60 micrometer and 3 mm.

In one embodiment the grooves extend in a lateral direction underneath the first doped layer at sides of the plurality of grooves. In other words, at the sides of the plurality of grooves the first doped layer (and the dielectric layer overlaying the first doped layer) comprises an overhanging part or a cantilever. The lateral size of this overhanging part can for example be in the range between about 1 micrometer and 5 micrometer.

Performing a directional doping process can comprise performing an ion implantation process, a plasma doping process, or a suitable low pressure deposition process with high anisotropy.

In one embodiment, the method may further comprise providing, before the dopant diffusion process, a second doped layer at a front side of the substrate, the second doped layer having the same dopant type as the substrate. The dopant diffusion process then results also in the formation of a doped region at the front side of the silicon substrate, for example providing a front side field in the photovoltaic cell.

In one embodiment, the method can further comprise providing a surface passivation layer at the front side and at the rear side of the substrate, providing an antireflection coating at the front side, and providing emitter contacts and base contacts at the rear side.

Providing emitter contacts and base contacts can for example comprise providing openings through the different layers present at the rear side, for example by laser ablation, to locally expose the doped regions of the first type and the doped regions of the second type. Next a thin metal seed layer can be provided, followed by electroplating. Alternatively, emitter contacts and base contacts can be provided by vacuum evaporation, wherein the presence of cantilevers may lead to a separation of both contact types.

It is an advantage of a manufacturing method according to certain embodiments that it is litho-free. A method according to certain embodiments may be based on laser patterning, which is a clean technology, on underetching and on ion-implantation.

For purposes of illustration, certain objects and advantages of various inventive aspects have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein. Further, it is understood that this summary is merely an example and is not intended to limit the scope of the invention. The invention, both as to organization and method of operation, together with features and advantages thereof, may best be understood by reference to the following detailed description when read in conjunction with the accompanying drawings.

Figure 1:
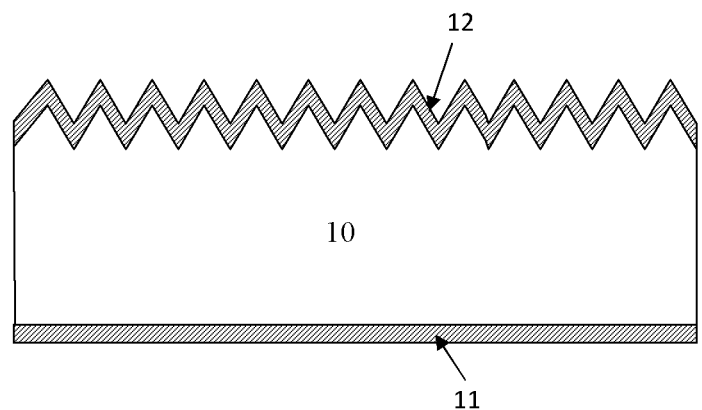
FIG. 1 to FIG. 8 schematically illustrate an exemplary method according to one embodiment.

In the different drawings, the same reference signs refer to the same or analogous elements.

DETAILED DESCRIPTION OF CERTAIN ILLUSTRATIVE EMBODIMENTS

In the following detailed description, numerous specific details are set forth in order to provide a thorough understanding of the invention and how it may be practiced in particular embodiments. However, it will be understood that the present invention may be practiced without these specific details. In other instances, well-known methods, procedures and techniques have not been described in detail, so as not to obscure the present disclosure. While the present invention will be described with respect to particular embodiments and with reference to certain drawings, the invention is not limited hereto. The drawings included and described herein are schematic and are not limiting the scope of the invention. It is also noted that in the drawings, the size of some elements may be exaggerated and, therefore, not drawn to scale for illustrative purposes.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, bottom, over, under and the like in the description and in the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising" should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B.

In certain embodiments, the front surface or front side of a photovoltaic cell is the surface or side adapted for being oriented towards a light source and thus for receiving illumination. The back surface, back side, rear surface or rear side of a photovoltaic cell is the surface or side opposite to the front surface. The front side of a substrate is the side of the substrate corresponding to the front side of the photovoltaic cell to be fabricated, while the rear side or back side of the substrate corresponds to the back side of the photovoltaic cell to be fabricated.

Interdigitated means intermingled, whereby items from one group and items from another group are alternately presented. In particular, the interdigitation relates to the back contacts of a photovoltaic cell. Advantages of such interdigitated back contacts are a lack of grid shading loss.

A method for fabricating interdigitated back contact photovoltaic cells according to one embodiment of the present invention comprises: providing on a rear surface of a semiconductor, e.g. silicon, substrate a first doped layer comprising a first dopant type; providing a dielectric masking layer overlaying the first doped layer; forming a plurality of grooves through the dielectric masking layer and the first doped layer, the plurality of grooves extending into the semiconductor substrate in a direction substantially orthogonal, e.g. orthogonal, to the rear surface of the semiconductor substrate and extending in a lateral direction underneath the first doped layer at sides of the plurality of grooves; performing a directional doping step in a direction substantially orthogonal to the rear surface, thereby providing doped regions with dopants of a second dopant type different from the first dopant type at a bottom of the plurality of grooves; performing a dopant diffusion step, thereby forming at the rear side of the substrate doped regions of a first type in between the plurality of grooves and doped regions of a second type at the bottom of the plurality of grooves.

An example of a fabrication process for IBC photovoltaic cells in accordance with a method according to one embodiment is illustrated in FIG. 1 to FIG. 8. The method is illustrated for an exemplary embodiment wherein a semiconductor substrate comprising dopants of a first dopant type, e.g. an n-type silicon substrate, e.g. having a resistivity in the range between about 0.5 Ohm cm and 10 Ohm cm, is used. However, the method is not limited thereto and can also be used for fabricating photovoltaic cells on substrates of another semiconductor material, e.g. germanium substrates, and/or of another dopant type, e.g. p-type substrates.

After texturing the front side of an n-type substrate 10, a first doped layer, e.g. a first oxide layer 11 comprising a dopant of the first type, e.g. an n-type dopant such as for example a phosphorous doped oxide layer, is provided at the rear side of the substrate (FIG. 1). A second doped layer, e.g. a second doped oxide layer 12 comprising a dopant of the first type, e.g. an n-type dopant, such as for example a phosphorous doped oxide layer, can be provided at the front side of the substrate 10. The first and second doped layers, e.g. the phosphorous doped oxide layers 11, 12, can for example be a $POCl_3$ glass, a phosphorous doped CVD oxide or any other suitable doped oxide layer known to a person skilled in the art. The first doped oxide layer 11 and the second doped oxide layer 12 can be provided simultaneously, e.g. in one oxidation step. As an alternative to a doped oxide layer, other suitable types of doped layers known to a person skilled in the art can be used such as for example an ion implanted silicon layer.

Figure 2:
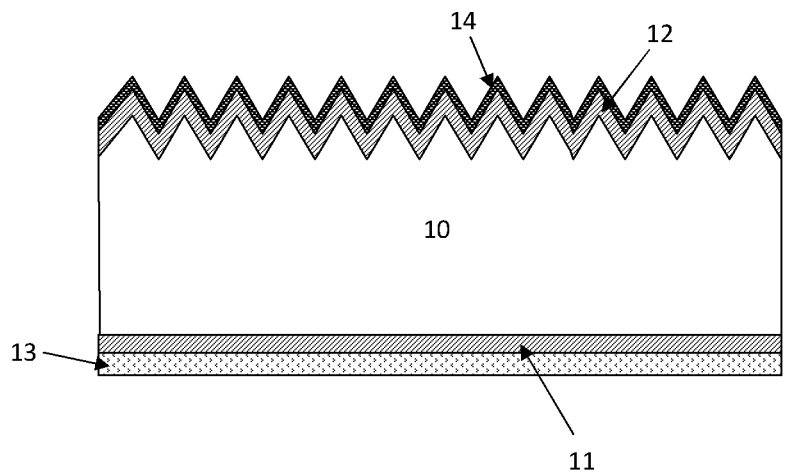
Figure 3:
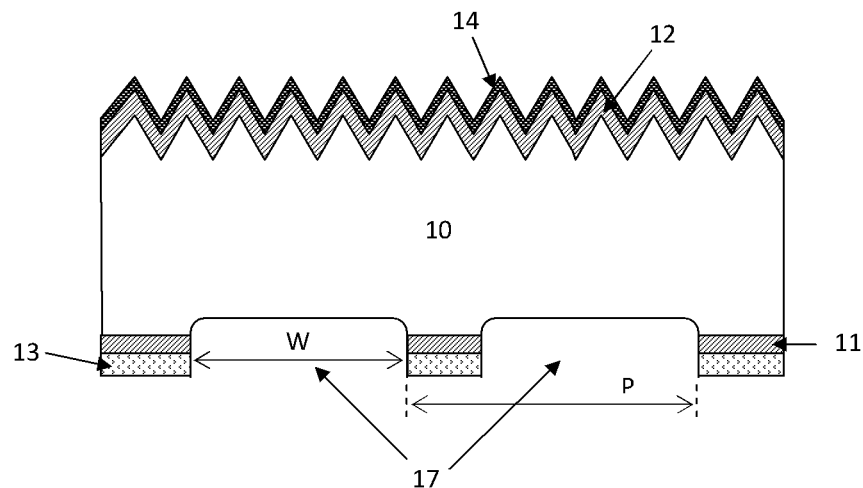

Next, as illustrated in FIG. 2, a dielectric layer or a dielectric layer stack 13, is provided at the rear side of the substrate 10, the dielectric layer stack 13 overlaying the first doped layer, e.g. oxide layer 11. The dielectric layer stack 13 can for example comprise a deposited silicon oxide layer (e.g. having a thickness in the range between about 50 nm and 1 micrometer), and/or a silicon nitride layer (e.g. having a thickness in the range between about 50 nm and 500 nm, e.g. having a thickness in the range between about 50 nm and 150 nm, e.g., having a thickness of about 100 nm).

The dielectric layer stack 13 at the rear side may comprise a material for passivation, e.g. a silicon nitride layer, that may be used as a hydrogen source to passivate the rear surface of the photovoltaic cell. In addition, it may provide a protection from the metal that is provided in a later stage of the process when forming the electrodes. In some embodiments of the present invention a rear surface passivation layer or layer stack can be provided in a later stage of the process. In such embodiments all layers present at the rear side of the substrate (first doped layer 11 and, if present, dielectric layer stack 13) can be removed after performing the dopant diffusion step, and a rear side passivation layer or layer stack can be provided afterwards.

At the front side, an additional layer such as a silicon nitride layer 14 can be provided on the second doped oxide layer 12. The silicon nitride layer 14 can function as an antireflection coating in the final photovoltaic cell structure. Therefore, the thickness of the silicon nitride layer 14 is preferably in the range between about 50 nm and 150 nm. However, in some embodiments of the present invention, an antireflection coating can be provided in a later stage of the process, for example after performing the dopant diffusion step. In such embodiments the second doped layer 12 may be removed and a surface passivation layer may be provided after performing the dopant diffusion step and before providing an antireflection coating.

In a next step, a plurality of grooves 17 is formed in the substrate material, e.g. silicon (FIG. 3), at the rear side of the substrate 10 at locations where emitter regions will be formed in a later stage of the process. The plurality of grooves 17 can for example be formed by laser ablation. The grooves 17 have a shape corresponding to the shape of the emitter region to be formed in a later stage of the process. For example, the grooves can have a substantially rectangular shape, for example a rectangular shape, in a cross-section according to a plane parallel to the substrate rear surface, having the length of the photovoltaic cell to be formed and having a width W for example in the range between about 40 micrometer and 2 mm, for example in the range between about 100 micrometer and 1 mm, for example in the order of about 300 micrometer.

The pitch P between the grooves can for example be in the range between about 60 micrometer and 3 mm. The depth of the grooves is larger than the depth of the back surface field to be formed in a later stage of the process. The final depth d of the grooves (shown in FIG. 4, the actual depth of the grooves 17 within the substrate material) can for example be in the range between about 500 nm and 10 micrometer, e.g. between about 1 micrometer and 5 micrometer. As an alternative to laser ablation for the formation of grooves 17, other methods known to a person skilled in the art can be used, such as for example lithography and DRIE etching or screenprinting an etching paste for etching the dielectric layers, followed by etching the grooves in the substrate material, e.g. silicon.

Figure 4:
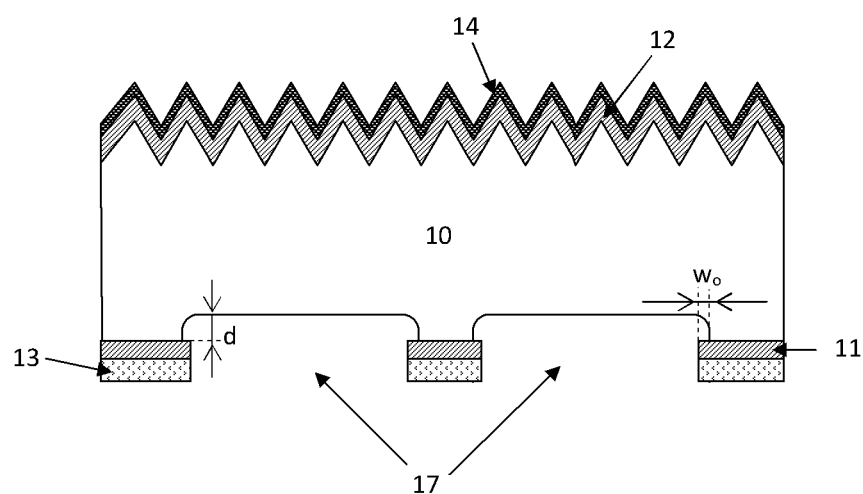

After laser ablation, a wet chemical etching is performed, e.g. with a NaOH-based or a KOH-based etching solution, using the dielectric layer 13 as a masking layer. The NaOH (or KOH) based etching solution may for example comprise about 100 g to 200 g NaOH (or KOH) per 1 liter of $H_2O$ and etching may be performed at a temperature of about 85° C. or less. However, in a method according to one embodiment, other suitable etching solutions known to a person skilled in the art can be used, such as for example a $HNO_3+BHF+H_2O$ based etching solution. The etching solution is selected such that the substrate material has a faster etch rate than the overlying layers 11, 13 at the rear side. The wet chemical etching step removes damage that may be caused in the substrate material, e.g. silicon, by the laser ablation step, and creates underetching due to the faster etch rate of the substrate, e.g. silicon substrate 10, as compared to the etch rate of the dielectric layer 13 and first doped layer, e.g. oxide layer 11. This results in a structure as shown in FIG. 4. Due to the underetching, at the sides of the grooves 17 overhanging parts or cantilevers are formed by the first doped layer, e.g. oxide layer 11, and the dielectric layer 13. The width $W_o$ of the overhanging parts, or thus the depth of the underetching, can for example be in the range between about 1 micrometer and 5 micrometer.

Figure 5:
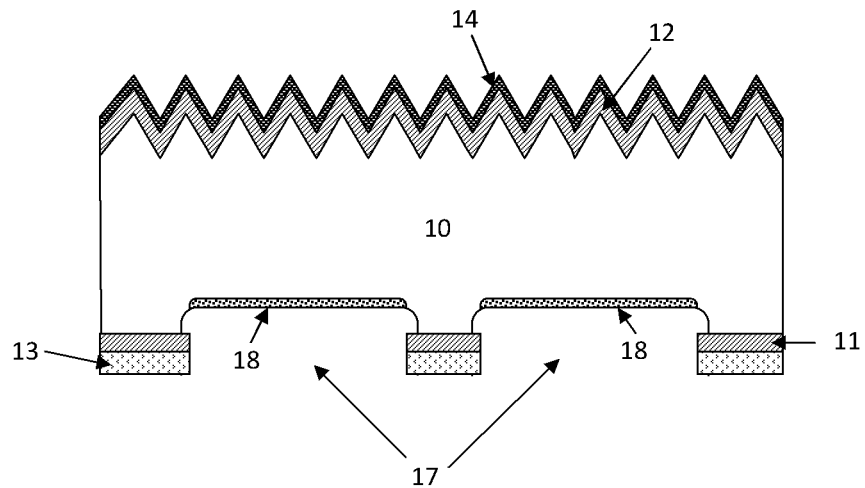

In a next step, illustrated in FIG. 5, a directional doping step with dopants of a second type, e.g. p-type dopants, such as for example a Boron implantation step, is performed at the rear side of the substrate 10, in a direction substantially orthogonal, e.g. orthogonal, to the plane of the rear surface. As a result of the doping step, e.g. implantation step, doped regions 18 comprising a dopant of the second type, e.g. p-type dopant such as Boron, are formed at the rear side of the substrate 10 at a bottom of the plurality of grooves 17, where emitter regions are to be formed. As implantation is a highly directional step, the presence of the cantilevers at the sides of the grooves 17 leads, later on, to a separation between the emitter regions to be formed (using the doped regions 18 as a dopant source) at the bottom of the grooves and the back surface field (BSF) regions to be formed (using the first doped oxide layer 11 as a dopant source) in between the grooves 17. In certain embodiments of the present invention, other directional doping steps than ion implantation can be used, such as for example plasma doping or any other directional doping step known by a person skilled in the art.

Figure 6:
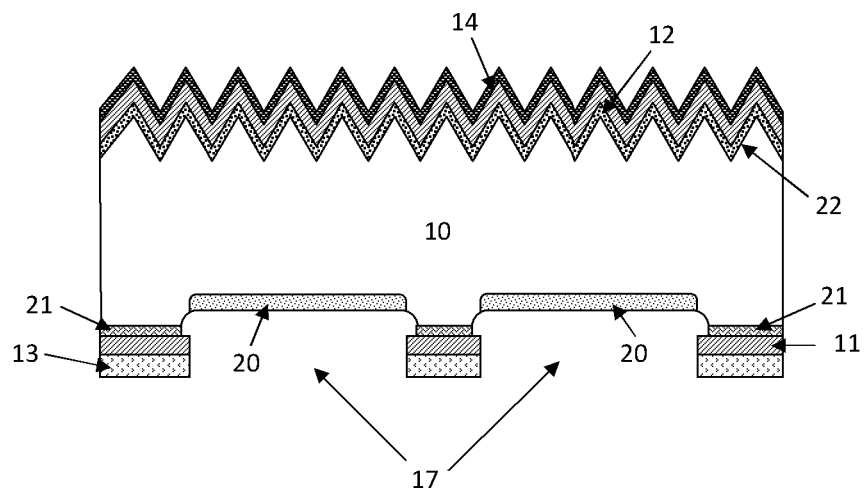

Next a high temperature step is performed, for example during about 5 to 10 minutes at a temperature in the range between about 1000° C. and 1050° C., leading (in a single step) to the diffusion of second type dopants, e.g. boron from doped regions 18, into the substrate material, e.g. silicon, in the grooves at the rear side of the substrate 10, thereby forming emitter regions 20; to the diffusion of first type dopants, e.g. phosphorous from the first doped layer, e.g. oxide layer 11, into the substrate material, e.g. silicon, at the rear side of the substrate surface in between grooves 17, thereby forming back surface field regions 21; and leading to the diffusion of first type dopants, e.g. phosphorous, from the second doped layer, e.g. oxide layer 12 at the front side, thereby forming front surface field regions 22 at the textured front surface of the photovoltaic cell. Due to the presence of cantilevers at the sides of the grooves 17, this process leads to a good separation between regions of the first dopant type, e.g. n+ regions (BSF regions 21), and regions of the second dopant type, e.g. p+ regions (emitter regions 20), at the rear side, without the need for providing masking layers e.g. at the sidewalls of the grooves. The resulting structure is shown in FIG. 6.

Figure 7:
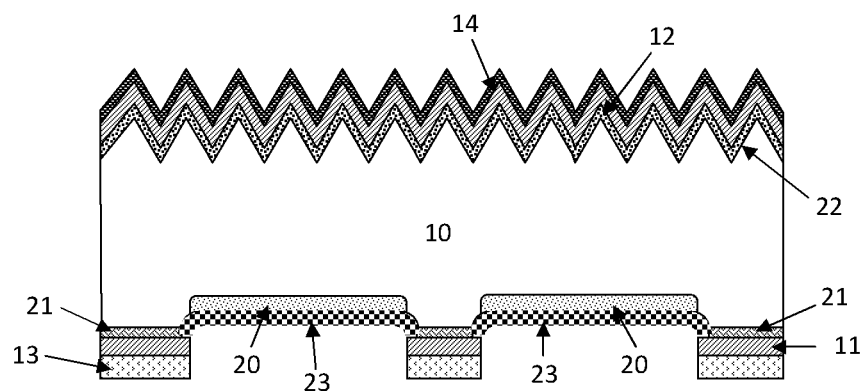

Next a surface passivation layer 23 is provided at the rear side of the structure, more in particular at the exposed substrate surface, e.g. silicon surface, of the grooves 17 (FIG. 7). The surface passivation layer 23 can for example be a stack comprising a thermal oxide (e.g. having a thickness in the range between about 3 nm and 10 nm) and a deposited oxide or nitride or a stack comprising an $Al_2O_3$ layer (e.g. with a thickness in the order of about 30 nm) and a deposited oxide layer or nitride layer, or any other layer or stack of layers suitable for passivation, and known to a person skilled in the art.

In certain embodiments of the present invention (not illustrated in the drawings), the different layers previously provided on the substrate 10 (dielectric layer 13, first doped layer 11, second doped layer 12) can be removed after the dopant diffusion step, followed by providing a surface passivation layer over the entire rear (and front) surface of the substrate 10.

A further process step comprises forming openings, for example by laser ablation, through the layers at the rear side, up to the doped semiconductor substrate material, e.g. silicon, to enable the formation of metal point contacts to the emitter regions 20 and the BSF regions 21. Openings are made through the surface passivation layer 23 such that the emitter regions 20 are locally exposed. Openings are also provided through the stack of layers in between the grooves 17 (first doped oxide layer 11, dielectric layer 13 in the example shown) such that the, in the embodiment illustrated, n+ doped BSF regions 21 are locally exposed.

Figure 8:
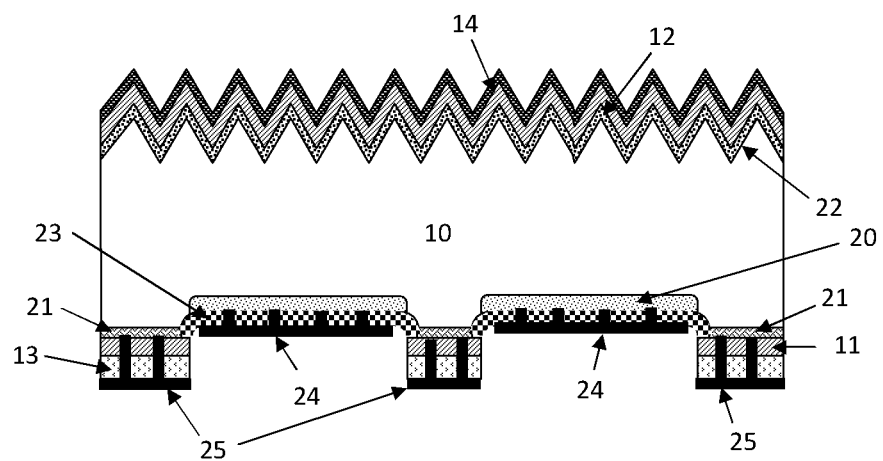

Finally metal contacts are provided through the openings formed through the layers covering the rear side of the semiconductor, e.g. silicon, substrate 10, more in particular emitter contacts 24 to the emitter regions 20 and base contacts 25 to the BSF regions 21 (FIG. 8). The emitter contacts 24 and the base contacts 25 are preferably interdigitated and can for example be comb-shaped. The metallization for forming both contact types can be done in a single process. Electrode separation between emitter contacts 24 and base contacts 25 can be obtained because of the presence of the grooves 17, leading to a metal discontinuity at the edges of the grooves. Metallization can for example be done by deposition of a seed layer, e.g. an about 100 nm thick seed layer comprising a Ti/Cu stack, followed by electroplating (e.g. about 4 micrometer thick Cu electroplating), or by deposition of a metal layer (for example an about 1 micrometer thick Al layer).

Although FIG. 1 to FIG. 8 illustrate a process sequence wherein emitter regions are formed at the bottom of the plurality of grooves and BSF regions are formed in between the grooves, the present invention is not limited thereto. For example, a method can also be used for fabricating IBC cells wherein BSF regions are formed at the bottom of the grooves and wherein emitter regions are formed in between the grooves.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. A method of manufacturing interdigitated back contact photovoltaic cells, the method comprising:
    providing on a rear surface of a semiconductor substrate a first doped layer comprising a first dopant type;
    providing a dielectric masking layer overlaying the first doped layer;
    forming a plurality of grooves through the dielectric masking layer and the first doped layer, the plurality of grooves extending into the semiconductor substrate in a direction substantially orthogonal to the rear surface and extending in a lateral direction underneath the first doped layer at sides of the plurality of grooves;
    performing a directional doping process in a direction substantially orthogonal to the rear surface, thereby providing doped regions with dopants of a second dopant type different from the first dopant type at a bottom of the plurality of grooves; and
    performing a dopant diffusion process, thereby forming regions of the first dopant type in the semiconductor substrate at the rear side of the substrate and between the plurality of grooves, and further forming regions of the second dopant type in the semiconductor substrate at the bottom of the plurality of grooves.

2. The method according to claim 1, wherein the process of forming a plurality of grooves comprises performing a dry etching process.

3. The method according to claim 1, wherein the process of forming a plurality of grooves comprises forming grooves by laser ablation followed by a wet etching of the formed grooves.

4. The method according to claim 1, wherein the process of forming a plurality of grooves comprises screenprinting onto the substrate a paste that selectively etches the dielectric masking layer and the first doped layer.

5. The method according to claim 1, wherein performing a directional doping process comprises performing one of an ion implantation, a plasma doping, and a low pressure deposition with high anisotropy.

6. The method according to claim 1, further comprising providing, before the dopant diffusion process, a second doped layer at a front side of the substrate, the second doped layer having dopants of a same dopant type as the substrate.

7. The method according to claim 1, further comprising providing one or more of a surface passivation layer at the front side and/or the rear side of the substrate, and an antireflection coating at the front side or providing emitter contacts and base contacts at the rear side.

8. The method according to claim 7, wherein the process of providing emitter contacts and base contacts comprises:
    providing openings through the dielectric masking layer and through the first doped layer provided at the rear side to locally expose the regions of the first dopant type;
    providing openings through the surface passivation layer provided at the rear side to locally expose the regions of the second dopant type;
    providing the base contacts contacting the regions of the first dopant type; and
    providing the emitter contacts contacting the regions of the second dopant type.

9. The method according to claim 8, further comprising providing a metal seed layer before electroplating the emitter and base contacts.

10. The method according to claim 8, wherein providing emitter contacts and base contacts is performed in a single metallization step.

11. The method according to claim 1, wherein the process of forming a plurality of grooves includes forming a cantilever in the first doped layer and the dielectric masking layer at the sides of the grooves.

12. The method according to claim 1, wherein the method does not include any lithography step.

13. The method according to claim 1, wherein regions of the first dopant type are backside surface field regions of the photovoltaic cells and regions of the second dopant type are emitter regions of the photovoltaic cells.

14. The method according to claim 1, wherein regions of the first dopant type are emitter regions of the photovoltaic cells and regions of the second dopant type are backside surface field regions of the photovoltaic cells.

15. A method of manufacturing interdigitated back contact photovoltaic cells, the method comprising:
    forming a plurality of grooves through a first doped layer located on a rear surface of a substrate and a dielectric masking layer overlaying the first doped layer, the first doped layer comprising a first dopant type, the plurality of grooves extending into the substrate in a direction substantially perpendicular to the rear surface and extending in a direction substantially parallel to the rear surface underneath the first doped layer at sides of the plurality of grooves; and
    performing a directional doping process in a direction substantially perpendicular to the rear surface so as to provide doped regions with dopants of a second dopant type different from the first dopant type at a bottom of the plurality of grooves.

16. The method according to claim 15, further comprising performing a dopant diffusion process to form regions of the first dopant type in the substrate at the rear side of the substrate and between the plurality of grooves, and to further form regions of the second dopant type in the substrate at the bottom of the plurality of grooves.

17. The method according to claim 16, wherein the dopant diffusion process to form the regions of the first and second dopant types are performed in a single step.

18. The method according to claim 16, wherein the regions of the first and second dopant types are formed simultaneously.

19. The method according to claim 16, further comprising providing, before the dopant diffusion process, a second doped layer at a front side of the substrate, the second doped layer having dopants of a same dopant type as the substrate.

20. The method according to claim 19, wherein the dopant diffusion process also forms a front surface field, and the dopant diffusion process is performed in a single step to form the regions of the first and second dopant types and the front surface field.

21. The method according to claim 15, wherein the grooves have a substantially rectangular shape in a plane parallel to the rear surface.

\* \* \* \* \*